(12) United States Patent
Sukegawa (10) Patent No.: US 6,834,322 B2
(45) Date of Patent: Dec. 21, 2004

(54) NONVOLATILE SEMICONDUCTOR MEMORY DEVICE HAVING PLURAL MEMORY CIRCUITS SELECTIVELY CONTROLLED BY A MASTER CHIP ENABLE TERMINAL OR AN INPUT COMMAND AND OUTPUTTING A PASS/FAIL RESULT

(75) Inventor: Hiroshi Sukegawa, Tokyo-To (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 394 days.

(21) Appl. No.: 09/731,788

(22) Filed: Dec. 8, 2000

(65) Prior Publication Data

US 2001/0018724 A1 Aug. 30, 2001

(30) Foreign Application Priority Data

Dec. 8, 1999 (JP) .......................................... 11-349388

(51) Int. Cl.[7] ............................................. G06F 12/00
(52) U.S. Cl. ........................... 711/103; 711/5; 711/168; 365/185.11; 365/185.33; 365/230.03
(58) Field of Search ........................... 711/103, 5, 168; 365/185.11, 185.29, 185.33, 230.03, 230.06

(56) References Cited

U.S. PATENT DOCUMENTS

| | | | | |
|---|---|---|---|---|
| 5,548,741 A | * | 8/1996 | Watanabe | 711/103 |
| 5,603,001 A | | 2/1997 | Sukegawa et al. | 711/103 |
| 5,809,515 A | * | 9/1998 | Kaki et al. | 711/103 |
| 5,812,814 A | * | 9/1998 | Sukegawa | 711/103 |
| 5,822,251 A | * | 10/1998 | Bruce et al. | 365/185.33 |
| 5,890,192 A | * | 3/1999 | Lee et al. | 711/103 |
| 6,131,139 A | * | 10/2000 | Kikuchi et al. | 711/103 |

FOREIGN PATENT DOCUMENTS

| | | | |
|---|---|---|---|
| JP | 62-217496 | * | 9/1987 |
| JP | 04-057295 | * | 2/1992 |
| JP | 05-120154 | * | 5/1993 |
| JP | 11-296439 | | 10/1999 |

\* cited by examiner

*Primary Examiner*—Donald Sparks
*Assistant Examiner*—Christian P. Chace
(74) *Attorney, Agent, or Firm*—Oblon, Spivak, McClelland, Maier & Neustadt, P.C.

(57) ABSTRACT

A nonvolatile semiconductor memory device capable of controlling a single memory chip similar to a plurality of memory chips. The memory chip has a plurality of Electrically Erasable Programmable Read Only Memory circuits, each of which includes a control circuit for carrying out sequential writing control and which EEPROM circuits share a data bus. Each of the EEPROM circuits has a Chip Enable terminal CE and a Ready/Busy terminal R/B, so that data writing processes can be simultaneously carried out in the respective EEPROM circuits in parallel. The activity and inactivity of each of the EEPROM circuits may also be controlled by a logical combination of a master chip enable signal and a chip enable signal of each of the individual EEPROM circuits. A pass or fail result of writing operations may be output or held and accumulated, with the nonvolatile semiconductor memory device having modes of operation in which it is determined whether data may be input to a data buffer by selectively referring to a pass/fail result.

13 Claims, 9 Drawing Sheets

NONVOLATILE SEMICONDUCTOR MEMORY DEVICE HAVING PLURAL MEMORY CIRCUITS SELECTIVELY CONTROLLED BY A MASTER CHIP ENABLE TERMINAL OR AN INPUT COMMAND AND OUTPUTTING A PASS/FAIL RESULT

CROSS REFERENCE TO RELATED APPLICATION

This application claims benefit of priority under 35 U.S.C. § 119 to Japanese Patent Application No. Hei 11-349388 (1999), filed on Dec. 8, 1999, the entire contents of which are incorporated by reference therein.

BACKGROUND OF THE INVENTION

The present invention relates generally to an Electrically Erasable Programmable Read Only Memory (EEPROM). More specifically, the invention relates to an EEPROM wherein a series of rewriting operations including verify operations are automatically sequentially controlled by a control circuit included in the EEPROM.

In recent typical EEPROM flash memories, a control circuit for sequentially controlling writing/erasing operations is provided in a chip. In an EEPROM of this type, if a command and writing data are inputted from the outside, a series of operations including a data writing operation and the subsequent verify operation are automatically carried out until a predetermined writing is completed. Until the writing is completed after the writing operation is started, a busy signal is outputted to the outside to inhibit access.

Such a waiting time in the busy state of the EEPROM flash memory adversely affects the high-speed performance of a memory system. Therefore, in order to realize a high-speed performance in a flash memory system using a plurality of memory chips, it is effective to commonly use a data bus for time-sharing inputting commands and data to carry out internal operations in the plurality of memory chips in parallel. The inventors have proposed such a technique (Japanese Publication (Kokai) Nos. 07-302175 and 07-302176, U.S. Pat. No. 5,603,001, etc.).

However, in recent years, the storage capacity of a single chip of flash memories increases more and more. Assuming that a single chip is enough for the storage capacity of a required memory system, the above described time-sharing control technique using the plurality of chips can not be applied, so that the high-speed performance can not be obtained. Therefore, it is desired to provide a single chip capable of realizing a high-speed performance by the same time-sharing control and parallel processing as those when the above described plurality of chips are used.

As circumstances on the side of a Central Processing Unit (CPU) for controlling a memory system, there are also circumstances wherein even if the storage capacity of a required memory system increases, the size of a handled file other than image files often does not remarkably increase, and many small-size files are rather preferably handled. The page mapping size of the CPU of personal computers is also maintained to be, e.g., 4 kilobytes, as a common value regardless of the generation of the CPU.

In view of such a host system environment, it is not always adequate to increase the writing page size and erasing block size of a memory device in accordance with the increase of the storage capacity of the memory device, and even if the storage capacity increases, there are often cases where writing and erasing can be preferably carried out every small capacity unit.

SUMMARY OF THE INVENTION

It is therefore an object of the present invention to eliminate the aforementioned problems and to provide a nonvolatile semiconductor memory device capable of controlling a single memory chip similar to a plurality of memory chips.

In order to accomplish the aforementioned and other objects, according to one aspect of the present invention, there is provided an electrically rewritable nonvolatile semiconductor memory device comprising: a plurality of memory circuits, each of which has a control circuit for sequentially controlling writing, provided in a memory chip so as to share a data bus, and a chip enable terminal for controlling the activity and inactivity of each of the memory circuits provided for each of the memory circuits.

According to another aspect of the present invention, there is provided an electrically rewritable nonvolatile semiconductor memory device having a plurality of memory circuits, each of which has a control circuit for sequentially controlling writing, provided in a memory chip so as to share a data bus, wherein the activity and inactivity of each of the memory circuits are controlled by inputting a command.

According to a further aspect of the present invention, there is provided an electrically rewritable nonvolatile semiconductor memory device having a plurality of memory circuits, each of which has a control circuit for sequentially controlling writing, provided in a memory chip so as to share a data bus, wherein the activity and inactivity of each of the memory circuits are controlled by inputting a command.

According to the present invention, a plurality of memory circuits (EEPROM circuits) in a single chip can be operated in time sharing or in parallel as if plural chips are operated. Therefore, unlike a case where the storage capacity of a single chip is simply increased by a single control circuit, even if a certain circuit is in a busy state, it is possible to access other memory circuits, so that it is possible to obtain a high-speed performance memory system without waiting time at sight from the outside.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of the present invention will be described below.

(First Preferred Embodiment)

Figure 1:
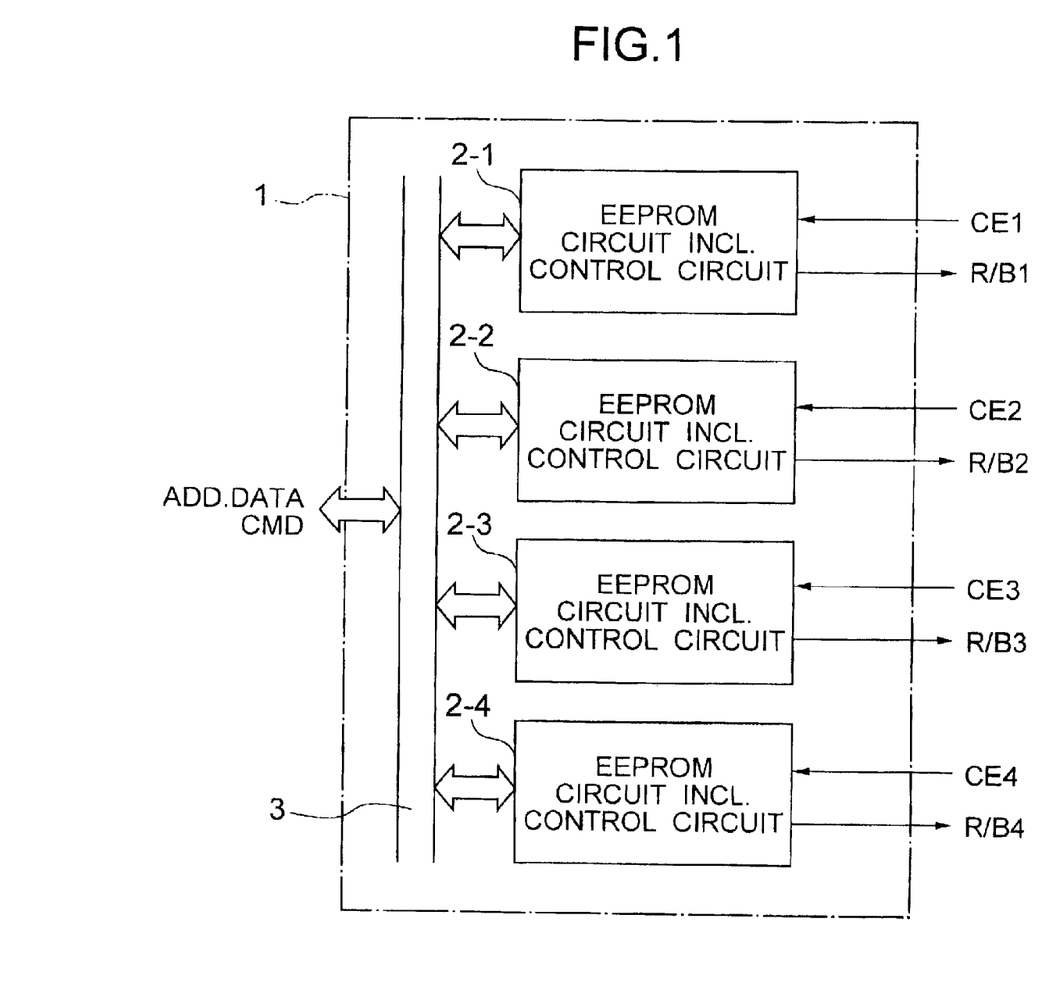
FIG. 1 is a block diagram of a preferred embodiment of a memory chip according to the present invention.

FIG. 1 shows the construction of a preferred embodiment of a memory chip 1 according to the present invention. The memory chip 1 has a plurality of (four in the case of the figure) EEPROM circuits 2 (2-1 through 2-4), each of which includes a control circuit for sequentially controlling writing and erasing. These EEPROM circuits 2 share a data bus 3. Each of the EEPROM circuits 2 independently has a usual EEPROM chip function. Therefore, as shown in the figure, the respective EEPROM circuits 2 have chip enable terminals CE1 through CE4 for controlling activity and inactivity, and Ready/Busy signal terminals R/B1 through R/B4.

Figure 2:
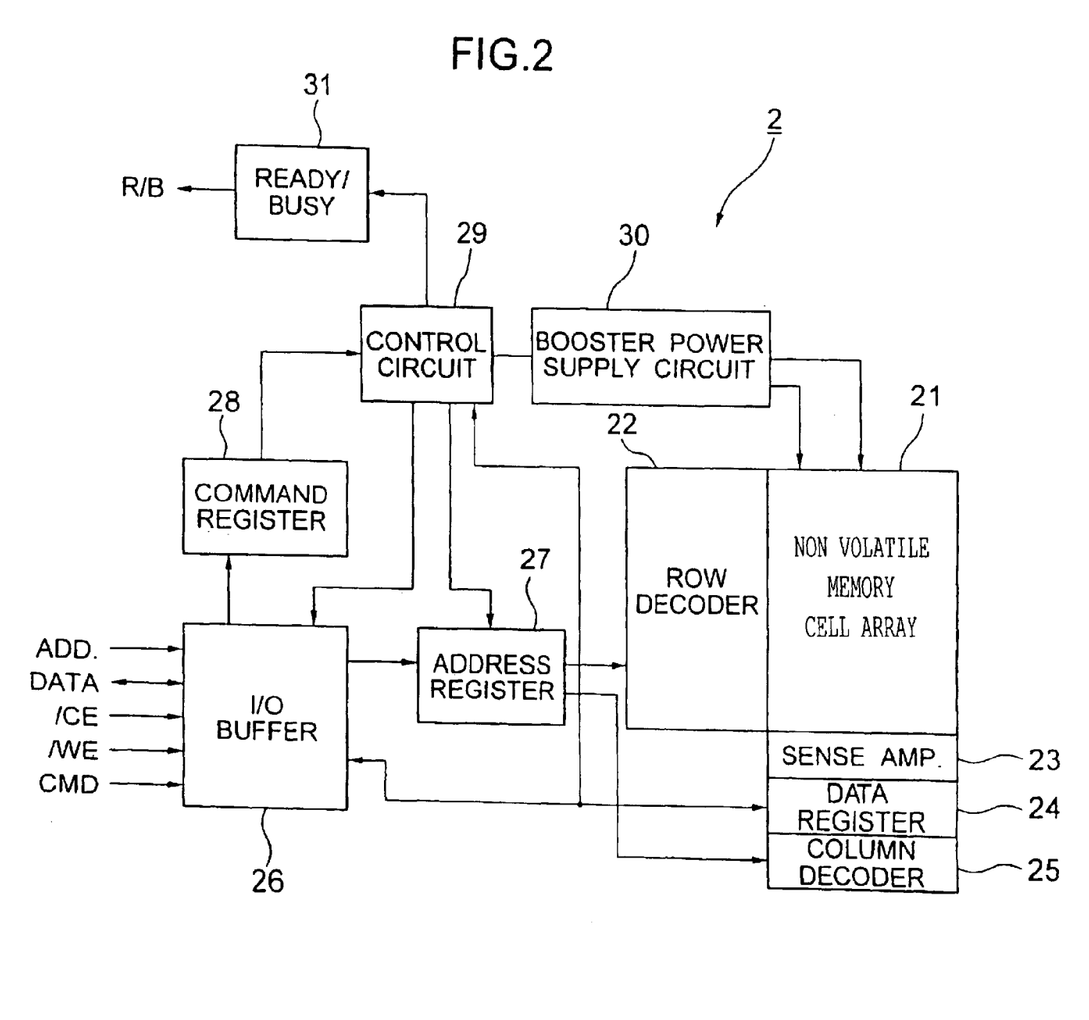
FIG. 2 is a block diagram showing the construction of each of the EEPROMs in the preferred embodiment.

FIG. 2 shows the construction of each of the EEPROM circuits 2. A memory cell array 21 has electrically rewritable nonvolatile memory cells which have a stacked gate structure and which are arranged and connected so as to form a NAND type. The word and bit lines of the memory cell array 21 are selected by a row decoder 22 and a column decoder 25, respectively. An address signal is incorporated into an address register 27, via an input/output (I/O) buffer, to be decoded by the row decoder 22 and the column decoder 25 to select a memory cell. The bit lines of the memory cell array 21 are connected to a sense amplifier 23 which is connected to the I/O buffer 26 via a data register 24.

In order to generate various high voltages for use in data writing and erasing, a booster power supply circuit 30 is provided. A control circuit 29 is designed to sequentially control data writing and erasing including verify operations, and simultaneously control the booster power supply circuit 30 in accordance with an operation mode. A command CMD for writing or erasing is incorporated into a command register 28 via the I/O buffer 26. The command incorporated into the command register 28 is decoded by the control circuit 29 to control writing or erasing in accordance with the command. Various enable signals including enable signals /CE, which are input to the chip enable terminals CE and which are indicative of the activity and inactivity of the whole circuit, enter the I/O buffer 26. The enable signals are also fed to the control circuit 29. The control circuit 29 outputs a busy signal to the terminal RIB via a Ready/Busy buffer 31 when the enable signal /CE=H.

In the memory chip 1 with such a construction, each of the EEPROM circuits 2 has the usual chip function, so that data writing or erasing can be carried out with respect to the respective EEPROM circuits 2 in parallel.

As described above, according to this preferred embodiment, a plurality of EEPROM circuits having an autonomous control function are provided in a single chip, so that it is possible to operate the EEPROM circuits in parallel to carry out a high-speed operation of a large-capacity memory. Each of the EEPROM circuits is provided with a chip enable terminal and a Ready/Busy terminal corresponding thereto, so that it is possible to control each of the EEPROM circuits from the outside as an independent memory chip. Therefore, unlike a case where the storage capacity of a single chip is simply increased, it is possible to realize a high-speed performance, and it is possible to flexibly cope with a request for inputting/outputting data for every small unit of storage capacity.

(Second Preferred Embodiment)

Figure 3:
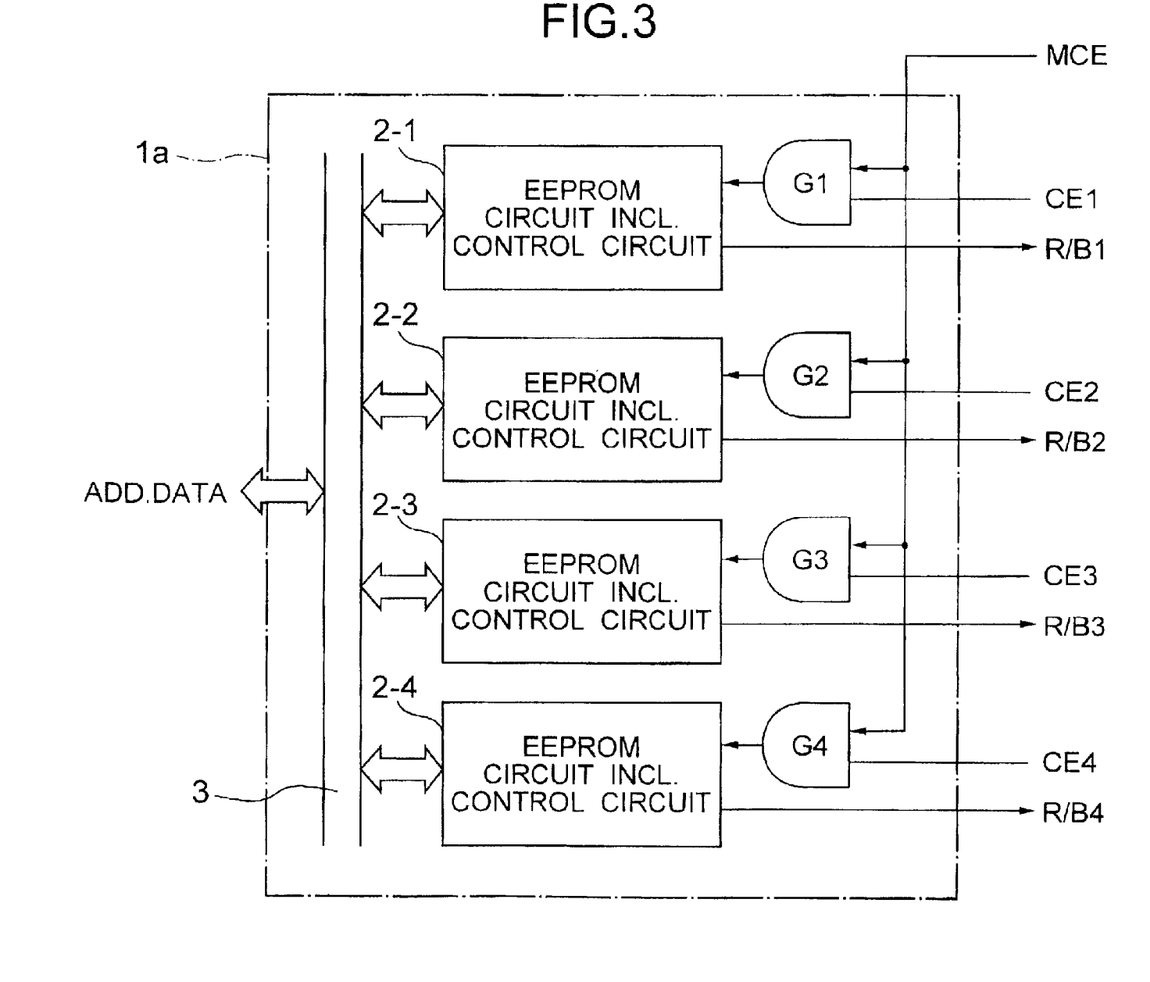
FIG. 3 is a block diagram of another preferred embodiment of a memory chip according to the present invention.

FIG. 3 shows another preferred embodiment of a memory chip according to the present invention. The difference between this preferred embodiment and the preceding preferred embodiment is that the memory chip 1a has a master chip enable terminal MCE for controlling the activity and inactivity of the whole memory chip 1a, in addition to chip enable terminals CE1 through CE4 of EEPROM circuits 2 provided therein.

Other constructions are the same as those in the preceding preferred embodiment.

The master chip enable terminal MCE and the chip enable terminal CE of each of the EEPROM circuits 2 are connected to the input of each of AND gates G1 through G4 as shown in FIG. 3, so that the AND output of two signals is supplied to each of the EEPROM circuits 2.

With such a construction, it is possible to decrease the number of signal lines which extend from a chip set for controlling a memory system comprising a plurality of memory chips.

It should be understood that other logical gates such as NAND or Exclusive-OR can also be used for the same purpose.

Figure 4:
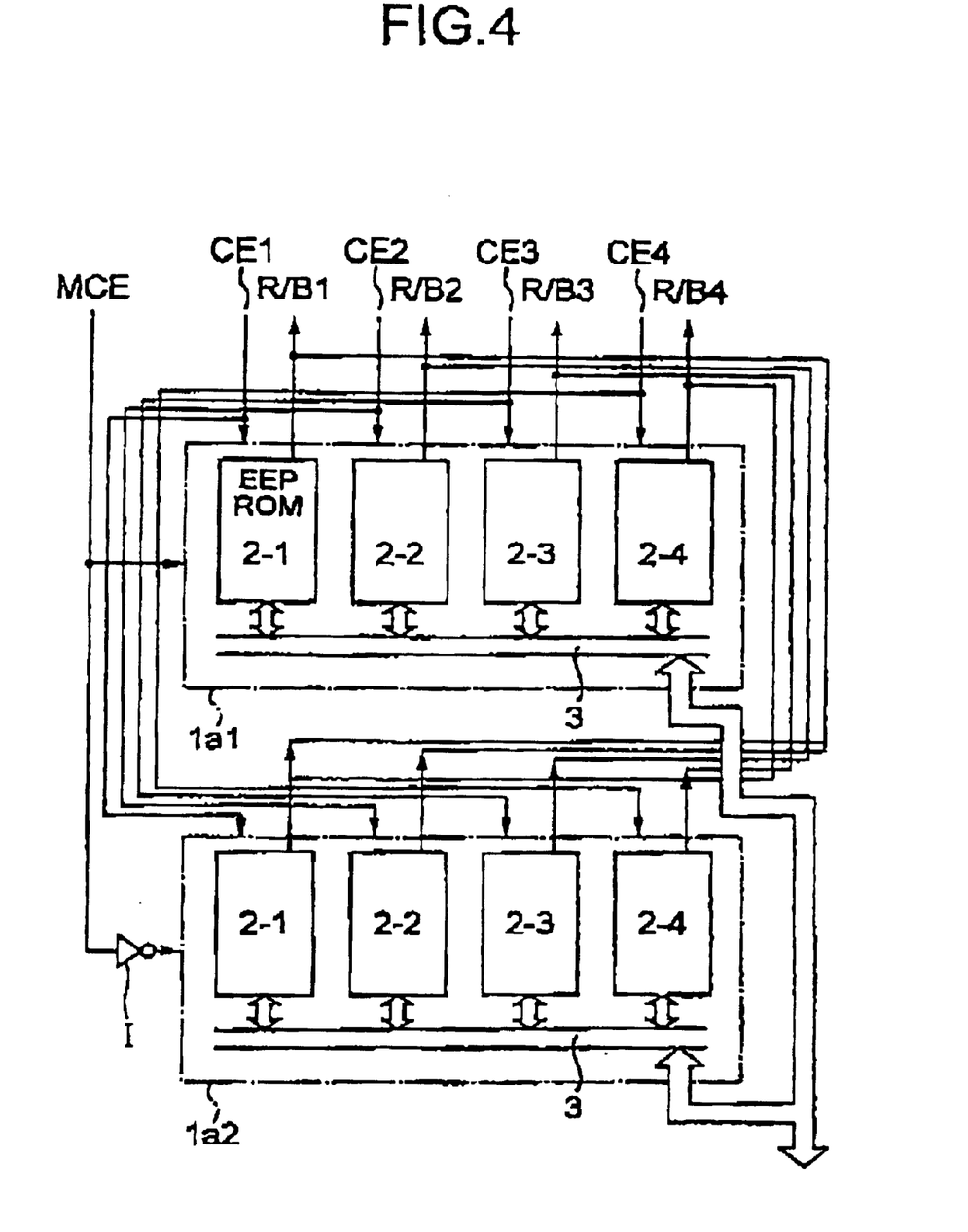
FIG. 4 is a block diagram of an example of a memory system using the memory chip in the preferred embodiment.

FIG. 4 shows an example of a case where two memory chips 1a1 and 1a2 are used. In this case, the chip enable terminals CE1 through CE4 of the two memory chips 1a1 and 1a2 are commonly connected to each other, and an inverter I is provided in one of the master chip enable terminals MCE which are commonly connected to each other. The Ready/Busy terminals R/B of the respective memory chips 1a1 and 1a2 are also commonly connected to each other.

Thus, it is possible to alternatively activate the memory chips 1a1 and 1a2 in accordance with "0" or "1" of the commonly connected master chip enable terminal MCE, so that a small number of signal lines can control the two memory chips 1a1 and 1a2.

Specifically, when a memory system is constructed as shown in FIG. 4, the operation of a chip set for controlling the memory, system in response to host-side requests is as follows. That is, it is assumed that the host's requests includes only the assignment of the chip enable terminals CE1 through CE4 and an address assignment. In this case, the chip set refers to a storage capacity register of the EEPROM circuits 2 of the memory chips 1a1 and 1a2 to determine "0" or "1" of the master chip enable terminal MCE. Then, the chip set issues a master enable signal together with the assignment of the chip enable terminals CE1 through CE4 and address assignment, which are host's requests. Thus, any one of the memory chips 1a1 and 1a2 is selected.

In the embodiment, three or more memory chips can be selected by using a selection circuit which outputs three or more states in response to a selection signal.

(Third Preferred Embodiment)

Figure 5:
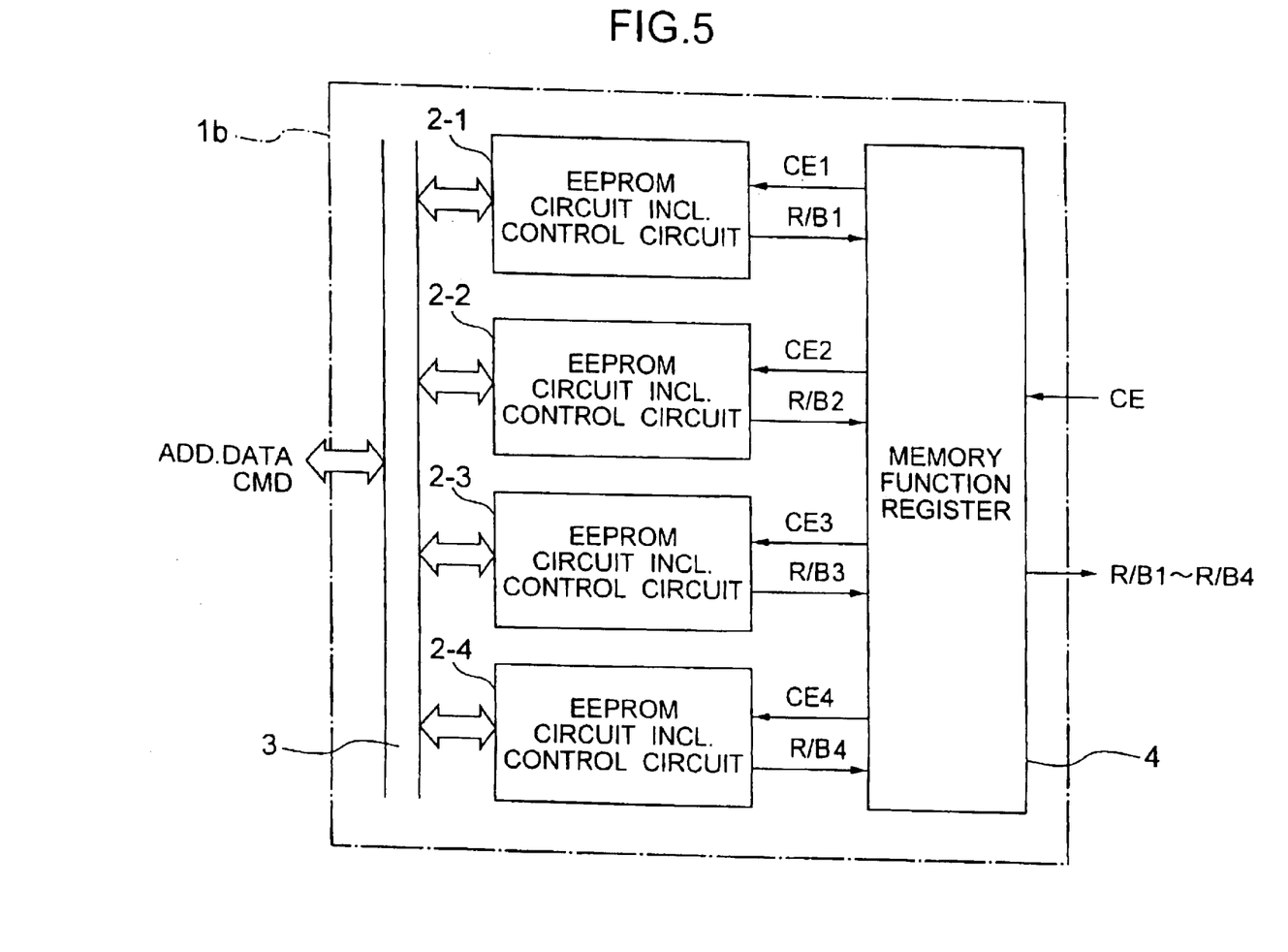
FIG. 5 is a block diagram of another preferred embodiment of a memory chip according to the present invention.

FIG. 5 shows another preferred embodiment of a memory chip lb according to the present invention. The difference between this preferred embodiment and the preferred embodiment shown in FIG. 1 is that only one chip enable terminal CE and only one Ready/Busy terminal R/B are provided. The chip enable terminals CE1 through CE4 and Ready/Busy terminals R/B1 through R/B4 of EEPROM circuits 2 are internally selected by a memory function register 4.

It is assumed that the memory function register 4 is controlled by inputting a command. For example, when the chip enable CE is activated to input a command to indicate that the chip enable terminal CE1, i.e., the EEPROM circuit 2-1, is selected, the memory function register 4 causes the chip enable CE to be enabled with respect to the EEPROM circuit 2-1. At this time, the Ready/Busy terminal R/B outputs the Ready/Busy state of the EEPROM circuit 2-1. When the chip enable CE is deactivated, the chip enable with respect to the whole memory chip 1b is negated.

If access sorting is thus carried out with respect to the plurality of EEPROM circuits in the memory chip, it is possible to control a large-capacity memory system by the same number of signal terminals as that in the case of a single EEPROM circuit. Therefore, the same CPU can be connected to any one of a number of memory chips, the generations of which are different, by only the change of a software.

When the chip enable signal CE is deactivated, it is seldom that control is continued for each EEPROM circuit is controlled continuously. Therefore, if the selection to each of the EEPROM circuits is released in connection therewith, the release of the selection can be easily controlled, and the subsequent control can be easily carried out.

On the side of the software, the control of activity and inactivity to each of the EEPROM circuits is carried out via the chip set. Therefore, if a single chip enable terminal is externally provided and if the enable of the internal EEPROM circuit is controlled by commands, the hardware structure of the memory is consistent. Such system contributes to reduce bugs in the control of the software.

(Fourth Preferred Embodiment)

Figure 6:
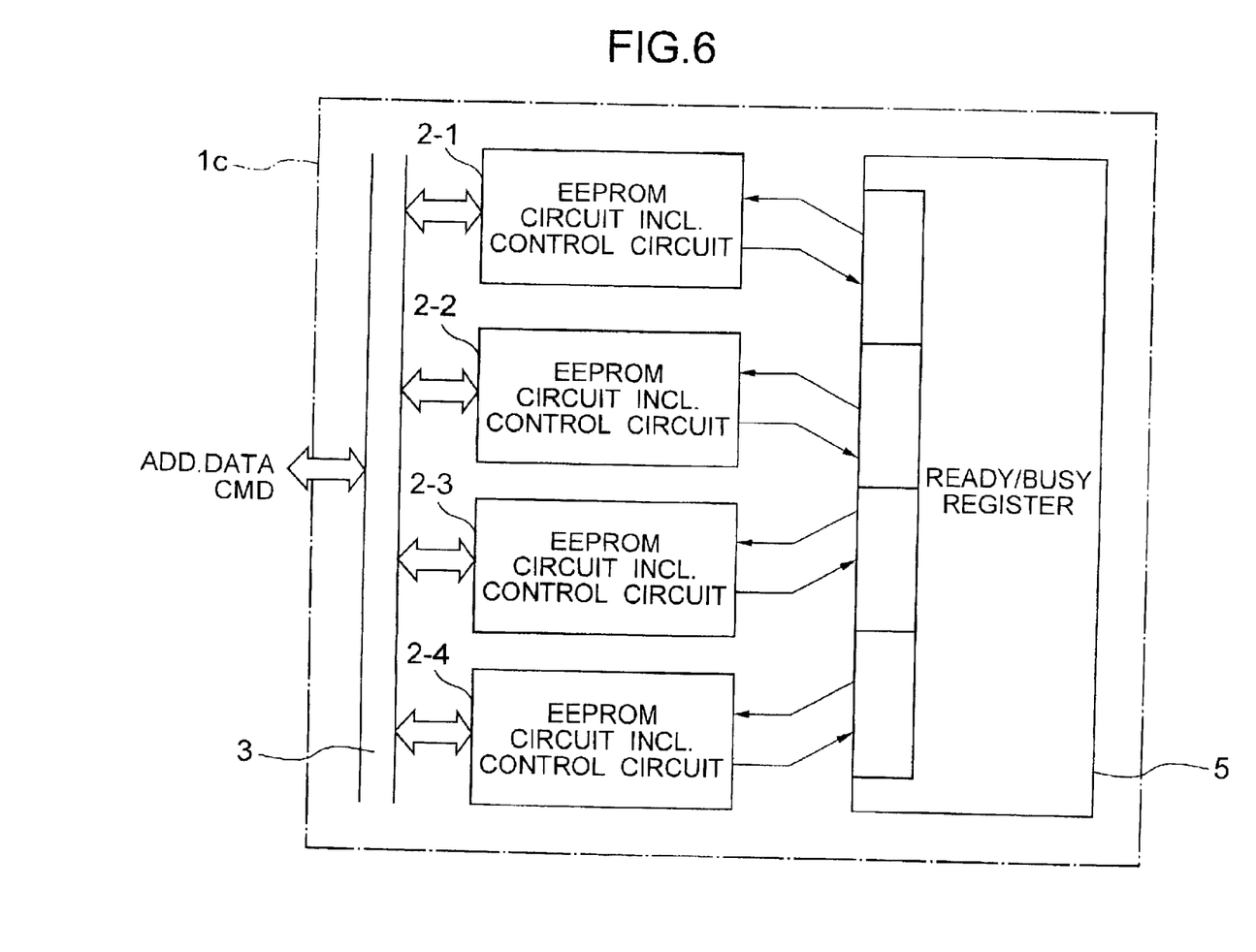
FIG. 6 is a block diagram of a further preferred embodiment of a memory chip according to the present invention.

FIG. 6 shows a preferred embodiment of a memory chip 1c according to the present invention as a modification of the preferred embodiment shown in FIG. 5. The difference between the memory chip 1c in this preferred embodiment and the memory chip shown in FIG. 5 is that the memory chip 1c does not have the chip enable terminal and Ready/Busy terminal outside and has a Ready/Busy register 5 for realizing their functions by a software. In this preferred embodiment, various commands CMD include a chip enable control command and a Ready/Busy reference command.

That is, in this preferred embodiment, a chip enable control command is inputted to generate internal enable signals CE1 through CE4 to each of the EEPROM circuits 2 of the memory chip 1c. In addition, a Ready/Busy reference command is inputted to refer to the register 5 by the software to obtain Ready/Busy state information from its returned value data.

According to such a preferred embodiment, it is not required to scan the signal terminals in order to monitor the Ready/Busy signal of each of the EEPROM circuits. Therefore, it is also not required to estimate a delay in switching transition time, such as a case where the same signal line is switched to output the Ready/Busy signal of each of the EEPROM circuits. Moreover, if a command control can acquire the Ready/Busy states of the respective EEPROM circuits at one time, it is possible to carry out a high-speed operation control.

If the memory chip is designed to operate in a conventional memory chip specification interchangeable mode (i.e., a specification wherein it is not recognized that a plurality of EEPROM circuit functions are provided inside) in an initialization state in which no command control is carried out, the system can be applied directly to conventional apparatuses. Moreover, if the state of the memory chip can be returned to the initial state by issuing a reset command, it is possible to initialize the memory chip when the abnormality on the side of the software is processed, so that it is possible to obtain a memory system having a high recovery with resiliency.

(Fifth Preferred Embodiment)

Figure 7:
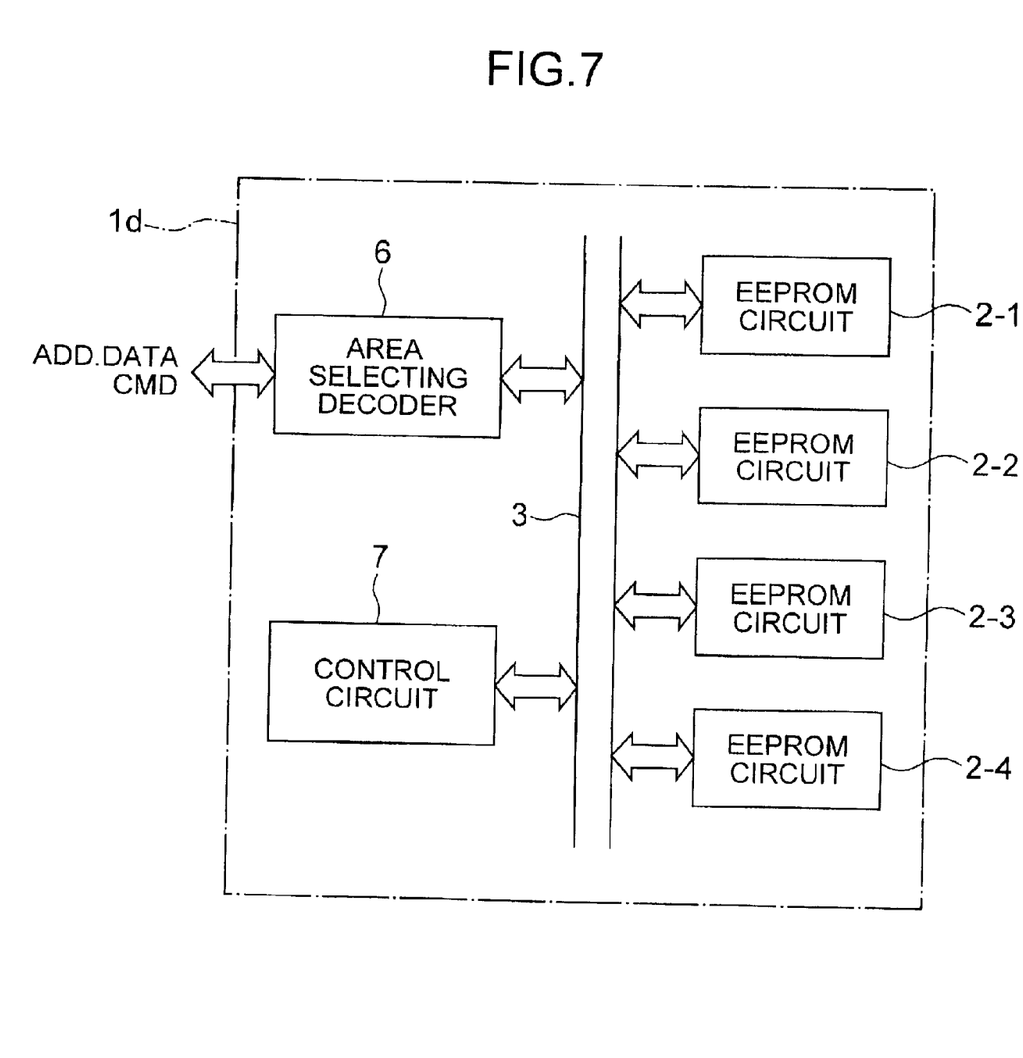
FIG. 7 is a block diagram of a still further preferred embodiment of a memory chip according to the present invention.

FIG. 7 shows another preferred embodiment of a memory chip 1d according to the present invention. In this preferred embodiment, an area selecting decoder 6 for selecting one of EEPROM circuits 2, which is to be written/erased, in response to an inputted command is provided in the memory chip 1d between a common data bus 3 for the EEPROM circuits 2 and an external I/O terminal. This area selecting decoder 6 allows commands, addresses and data to be inputted to the I/O buffer of each of the EEPROM circuits 2 in time sequence. In this case, it is assumed that it is possible to optionally set the order in which the EEPROM circuits should be selected. Each of the EEPROM circuits 2 does not include a control circuit, as do the EEPROM circuits in the non-limiting embodiments of FIGS. 1, 3, 5, and 6. A single control circuit 7 for controlling writing or the like in the EEPROM circuits 2 is provided.

According to this preferred embodiment, while data are written by, e.g., an EEPROM circuit 2-1, data can be inputted from the outside to other EEPROM circuits 2-2 through 2-4, so that continuous data writing operations can be carried out from the outside in with no waiting time.

Figure 8:
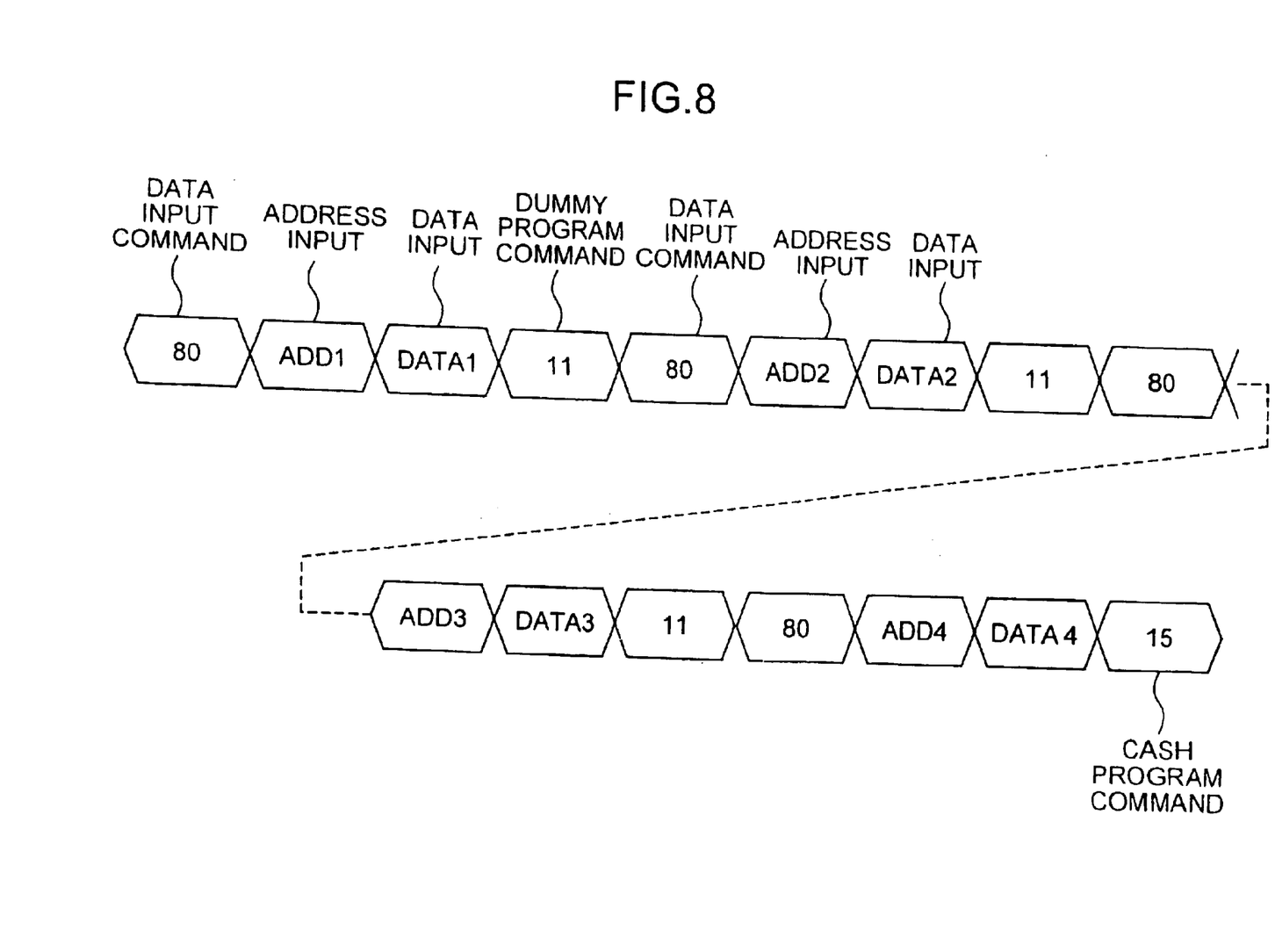
FIG. 8 is a schematic diagram showing an example of a control signal input in the preferred embodiment.
Figure 9:
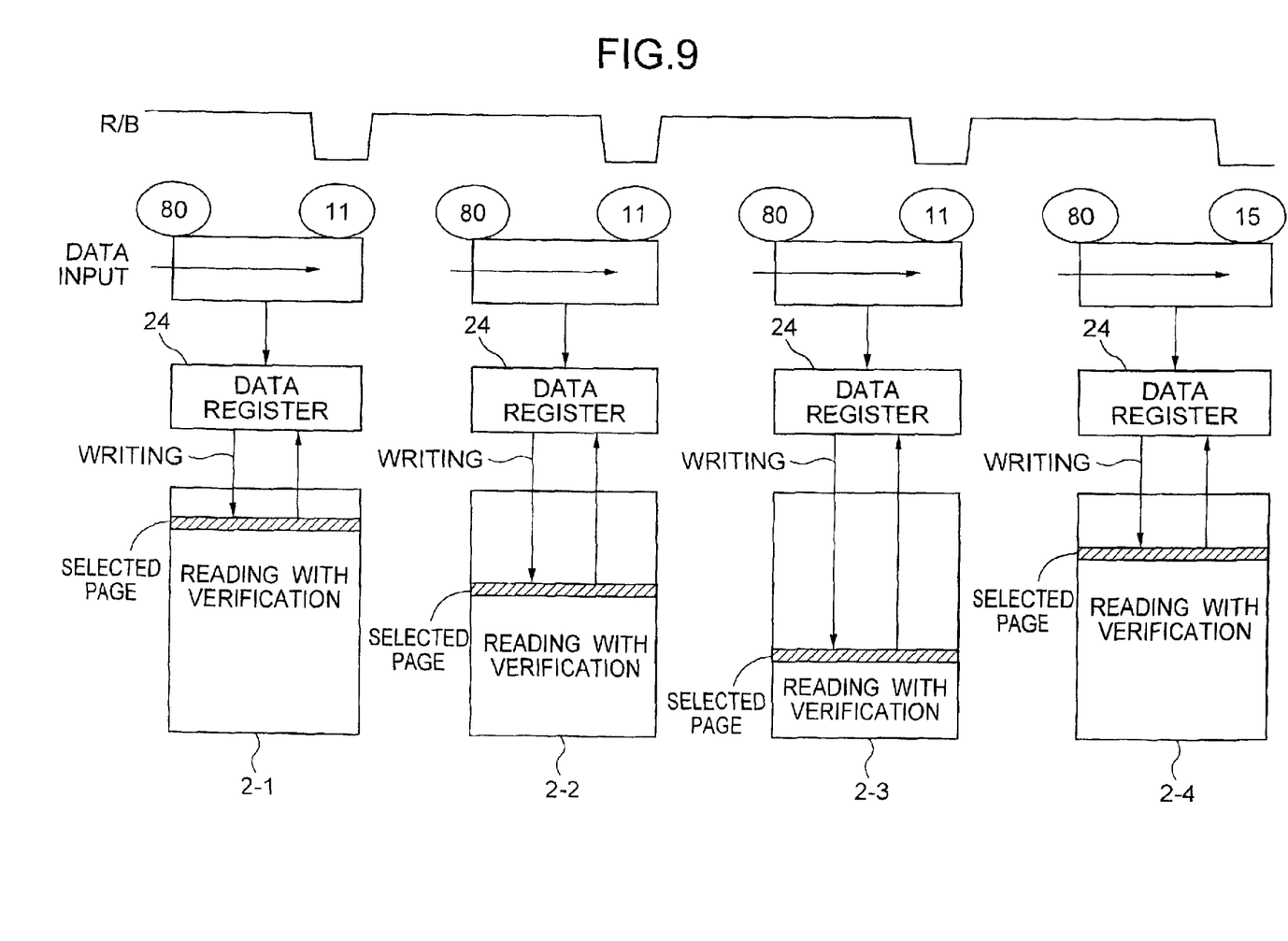
FIG. 9 is a schematic diagram showing a writing operation of each of EEPROMs in the preferred embodiment.

Referring to FIGS. 8 and 9, an example of the operation of a writing cache in this preferred embodiment will be described below.

As shown in FIG. 8, in order to write in the EEPROM circuit 2-1, a data input (writing) command "80", an address Add1 and a data Data1 are inputted, and thereafter, a dummy program command "11" is inputted. These are incorporated into the EEPROM circuit 2-1. The dummy program command "11" is a command for setting a busy without transferring the incorporated data to an internal data register 24. In order to carry out a cache operation, the data register 24 must have a two-stage construction. Similarly, in order to write in each of the EEPROM circuits 2, a data input command "80", an address Add and a data Data are inputted, and thereafter, a dummy program command "11" is inputted. Finally, a writing starting command "15" is inputted.

When the writing starting command "15" is inputted, data having been held by the latch provided in the I/O buffer of each of the EEPROM circuits 2 are simultaneously transferred to the internal data register 24. Thus, a writing operation is started in a page which has been selected by addresses in the respective EEPROM circuits 2 in parallel. When data writing is started, each of the EEPROM circuits 2 alternately carries out writing and verify until writing end conditions are automatically satisfied. When the batch data transfer to the internal data register is completed, the state becomes a ready state to the outside.

Preferably, in this preferred embodiment, the Pass/Fail result of the writing operation of each of the EEPROM circuits 2 is not only outputted, but the Pass/Fail result of the whole memory chip 1d is also outputted. Thus, each of the EEPROM circuits 2 can process in case of Fail, and if the whole Pass/Fail can be recognized, it is possible to determine whether the processing is continued or stopped, without referring to the written result of each of the EEPROM circuits 2.

In this preferred embodiment, the accumulated Pass/Fail results of the writing operations, which have been repeatedly carried out with respect to each of the EEPROM circuits 2, are preferably held to output information about the existence of failure during accumulation. Thus, the overall Pass/Fail can be determined after all of a series of writing operations are completed. In particular, when a writing cache like operation is carried out, a series of operations can be continuously carried out, so that it is possible to carry out a high-speed performance processing.

It is considered that the accumulation of the Pass/Fail results is carried out for each EEPROM or as a whole memory chip. In the former, it is possible to carry out a processing in the case of Fail for each EEPROM circuit. In the latter, it is not required to refer to each of the EEPROM circuits in the case of Pass.

In this preferred embodiment, it is preferably possible to select one of a mode, in which the next data are inputted to the data buffer after referring to the Pass/Fail result of data writing, and a mode, in which data are continuously inputted to the data buffer without referring to the Pass/Fail result. In this case, the meaning of how to output a Busy signal is different in the respective modes. That is, in the former mode, it is assumed that the Busy state is completed when the state of the written result can be referred. In this case, since the data writing is actually completed, the next data can be input. In the latter, it is assumed that the Busy state is completed when the next data writing can be carried out.

By enabling one to carry out such a mode selection, a high-speed processing and a stable processing can be selected. If this mode selection can be carried out by inputting a command, the control software can be simplified.

As described above, according to the present invention, it is possible to provide a nonvolatile semiconductor memory device capable of controlling a single memory chip similar to a plurality of memory chips.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. An electrically rewritable nonvolatile semiconductor memory device comprising:
   a plurality of memory circuits, each of said plurality of memory circuits having a control circuit for sequentially controlling writing, and all of said plurality of memory circuits being provided on a single memory chip so as to share a data bus, and
   a plurality of chip enable terminals for controlling the activity and inactivity of the memory circuits, respectively provided for each of the memory circuits; and
   a master chip enable terminal for controlling the activity and inactivity of said single memory chip as a whole, the activity and inactivity of each of said memory circuits being controlled by a logical output of a signal of said master chip enable terminal and a respective chip enable terminal;
   wherein each of said memory circuits is provided with a ready/busy signal terminal which corresponds to a respective chip enable terminal.

2. The electrically rewritable nonvolatile semiconductor memory device as set forth in claim 1, wherein said logical output is an output of an AND gate having the signal of said master chip enable terminal and the signal of the respective chip enable terminal as inputs.

3. An electrically rewritable nonvolatile semiconductor memory device comprising:
   a plurality of memory circuits, each of said plurality of memory circuits having a control circuit for sequentially controlling writing, and all of said plurality of memory circuits are provided on a single memory chip so as to share a data bus,
   wherein the activity and inactivity of each of the memory circuits are controlled by inputting a command, each of said plurality of memory circuits has a respective chip enable terminal, and a master chip enable terminal is provided for controlling the activity and inactivity of the single memory chip as a whole.

4. An electrically rewritable nonvolatile semiconductor memory device comprising:
   a plurality of memory circuits, each of said plurality of memory circuits having a control circuit for sequentially controlling writing, and all of said plurality of memory circuits beings provided on a single memory chip so as to share a data bus,
   wherein the activity and inactivity of each of the memory circuits are controlled by inputting a command, each of said plurality of memory circuits has a respective chip enable terminal, a common chip enable terminal is provided for said plurality of memory circuits, and an enable signal inputted to said common chip enable terminal is supplied to a selected one of said memory circuits which has been selected by inputting said command.

5. The electrically rewritable nonvolatile semiconductor memory device as set forth in claim 4, wherein a common ready/busy signal terminal is provided for said plurality of memory circuits, and a ready/busy state of said selected one of said memory circuits, which has been selected by inputting said command, is outputted to said common ready/busy signal terminal.

6. An electrically rewritable nonvolatile semiconductor memory device comprising;
   a plurality of memory circuits provided in a memory chip, each of said memory circuits including a corresponding at least one data buffer stage for storing writing data corresponding to an address, and
   wherein writing operations to write different data and different addresses in said plurality of memory circuits are simultaneously carried out and a pass/fail result of each of said writing operations is output to each of said memory circuits and accumulated in the corresponding at least one data buffer stage.

7. An electrically rewritable nonvolatile semiconductor memory device comprising:
   a plurality of memory circuits provided in a memory chip, each of said memory circuits including a corresponding at least one data buffer stage for storing writing data corresponding to an address, and wherein writing operations in said plurality of memory circuits are simultaneously carried out and a pass/fail result of each of said writing operations is output to each of said memory circuits;
   wherein said electrically rewritable nonvolatile semiconductor has a mode whereby each of said plurality of memory circuits determines whether data is able to be inputted to said corresponding at least one data buffer stage of said respective memory circuit by referring to that memory circuit's corresponding pass/fail result, and a mode in which each of said plurality of memory circuits determines whether data is able to be input to said corresponding at least one data buffer stage of said respective memory circuit without referring to that memory circuits corresponding pass/fail result.

8. The electrically erasable nonvolatile semiconductor of claim 1, wherein each of said memory circuits includes memory cells having a stacked gate structure.

9. The electrically erasable nonvolatile semiconductor of claim 6, wherein each of said memory circuits includes memory cells having a stacked gate structure.

10. The electrically erasable nonvolatile semiconductor of claim 7, wherein each of said memory circuits includes memory cells having a stacked gate structure.

11. The electrically erasable nonvolatile semiconductor of claim 8, wherein said memory cells are arranged in a NAND structure.

12. The electrically erasable nonvolatile semiconductor of claim 9, wherein said memory cells are arranged in a NAND structure.

13. The electrically erasable nonvolatile semiconductor of claim 10, wherein said memory cells are arranged in a NAND structure.

* * * * *